(12) United States Patent
Cho et al.

(10) Patent No.: US 8,637,851 B2
(45) Date of Patent: Jan. 28, 2014

(54) GRAPHENE DEVICE HAVING PHYSICAL GAP

(75) Inventors: Byung Jin Cho, Daejeon (KR); Jeong Hun Mun, Daegu (KR)

(73) Assignee: Korea Advanced Institute of Science and Technology (KR)

( * ) Notice: Subject to any disclaimer, the term of this patent is extended or adjusted under 35 U.S.C. 154(b) by 44 days.

(21) Appl. No.: 13/176,043

(22) Filed: Jul. 5, 2011

(65) Prior Publication Data

US 2012/0261645 A1   Oct. 18, 2012

(30) Foreign Application Priority Data

Apr. 12, 2011   (KR) .................. 10-2011-0033753

(51) Int. Cl.
*H01L 29/08*   (2006.01)

(52) U.S. Cl.
USPC .............. 257/39; 257/E29.042; 257/E29.297; 977/734

(58) Field of Classification Search
USPC ........................................... 257/39
See application file for complete search history.

(56) References Cited

U.S. PATENT DOCUMENTS

2010/0258787 A1* 10/2010 Chae et al. ................. 257/39
2011/0101308 A1*  5/2011 Avouris et al. ............. 257/27

FOREIGN PATENT DOCUMENTS

JP        2008-16500 A      1/2008

OTHER PUBLICATIONS

Y. M. Lin, C. Dimitrakopoulos, K. A. Jenkins, D. B. Farmer, H. Y. Chiu, A. Grill, PH. Avouris; 100-GHz Transistors from Wafer-Scale Epitaxial Graphene; Science, vol. 327, p. 662, Feb. 5, 2010.

* cited by examiner

*Primary Examiner* — David Vu
*Assistant Examiner* — Jonathan Han
(74) *Attorney, Agent, or Firm* — Park & Associates IP Law, P.C.

(57) ABSTRACT

Disclosed herein is a graphene device having a structure in which a physical gap is provided so that the off-state current of the graphene device can be significantly reduced without having to form a band gap in graphene, and thus the on/off current ratio of the graphene device can be significantly increased while the high electron mobility of graphene is maintained.

13 Claims, 8 Drawing Sheets

GRAPHENE DEVICE HAVING PHYSICAL GAP

REFERENCE TO RELATED APPLICATIONS

This application claims the priority benefit of Korean Patent Application No. 10-2011-0033753 filed on Apr. 12, 2011, the entire contents of which are incorporated herein by reference.

FIELD OF THE INVENTION

The present invention relates to the structure of a graphene device, and more particularly to a graphene device having a structure in which a physical gap is provided so that the off-state current of the graphene device can be significantly reduced without having to form a band gap in the graphene, and thus the on/off current ratio of the graphene device can be significantly increased while the high electron mobility of graphene is maintained.

BACKGROUND OF THE INVENTION

Graphene is a single layer of $sp^2$-hybridized carbon atoms that are arranged in two-dimensional hexagonal planes. Because electrons move in graphene as if they have no effective mass, graphene has a very high electron mobility of more than 100,000 $cm^2/V \cdot s$ even at room temperature.

Graphene also has a two-dimensional shape, so can be prepared using the CMOS technology currently being used, unlike cylindrical carbon nanotubes. Due to this advantage, graphene is receiving attention as a next-generation semiconductor material which will substitute for a semiconductor device.

However, graphene has a zero band gap, and shows a very high off-current. For this reason, the increase in on-current resulting from the high electron mobility of graphene is set off due to the increase in off-current, and its on/off current ratio have been reported as around 10.

In recent years, to solve this problem of graphene, there have been various attempts such as using nanoribbons, uniaxial strain to graphene, bilayer graphene, and various doping technique to open up the band gap. However, these methods cause additional defects in graphene during processes, thus significantly reducing the electron mobility of the graphene.

Therefore, forming a band gap in graphene compromises the advantage of the high electron mobility of the graphene, thus making it unsuitable to use graphene in a digital device.

SUMMARY OF THE INVENTION

Accordingly, in the perspective of the problems encountered previously, the object of this invention is introducing a novel approach to obtain high on/off current ratio by not opening band gap but introducing a physical gap between graphene channel and source/drain electrode.

To achieve the above object, in accordance with one aspect of the present invention, there is provided a graphene device comprising: a source and a drain formed on a substrate; a graphene channel formed on the substrate between the source and the drain; and a gate formed on a dielectric layer on the graphene channel, in which any one or more of the source and the drain are spaced apart from the graphene channel by a physical gap.

In the present invention, the graphene device may further comprise a high-K spacer made of a dielectric material on the left and right sides of a stack structure consisting of the graphene channel, the dielectric layer and the gate.

In the graphene device of the present invention, when a voltage lower than the threshold voltage of the device is applied to the gate, the off-current will be reduced due to the physical gap, and when a voltage higher than the threshold voltage is applied to the gate, a fringing field will be formed through the high-K spacer, so that the energy band of the substrate region under the high K-spacer can be inversed and the effective length of the physical gap can be reduced to increase the on-current by a breakdown occurring in the substrate region corresponding to the physical gap.

The high-K spacer may be made of a material having a dielectric constant of 3.9 or higher.

The substrate may be made of a semiconductor material selected from among silicon (Si), germanium (Ge), a III-V group compound (GaAs, InP, etc.), and combinations thereof.

The substrate may have an SOI structure.

The substrate may be made of an intrinsic semiconductor material or a semiconductor material doped with an n- or p-type impurity.

The source and the drain are doped with p+ and p+, n+ and n+, n+ and p+, or p+ and n+, respectively, wherein p+ means that the source or the drain is doped with a p-type impurity so that the impurity concentration thereof is higher than that of the substrate, and n+ means that the source or the drain is doped with an n-type impurity so that the impurity concentration is higher than that of the substrate.

The upper portion of the source or the drain may be treated with a metal to form a silicon compound (silicide). The silicon compound may be NiSi, CoSi, PtSi, NaSi, MgSi, TiSi, CuSi, CrSi, VSi, MnSi, FeSi, MnSi, GeSi, SnSi, PbSi, CaSi, RuSi, CeSi, RhSi, IrSi, ZrSi, HfSi, ThSi, PuSi, YSi, SrSi, USi or WSi.

By the physical gap between the source and the graphene channel, the source may be spaced apart from the graphene channel, and the drain may be extended to the graphene channel so as to come into contact with the graphene channel.

Alternatively, the physical gap between the drain and the graphene channel may space the drain apart from the graphene channel, and the source may be extended to the graphene channel so as to come into contact with the graphene channel.

Also, both the source and the drain may be spaced apart from the graphene channel by the physical gap.

The graphene channel may also include a plurality of graphene channels spaced apart from each other by a physical gap. In this regard, a gate may be formed on a dielectric layer formed on each of the plurality of graphene channels, and a high-K spacer may be formed on the left and right sides of each of stack structures, which are spaced apart from each other and each includes the graphene channel, the dielectric layer and the gate.

BRIEF DESCRIPTION OF THE DRAWINGS

The above and other objects, features and advantages of the present invention will be more clearly understood from the following detailed description taken in conjunction with the accompanying drawing, in which.

DETAILED DESCRIPTION OF THE INVENTION

Figure 1:
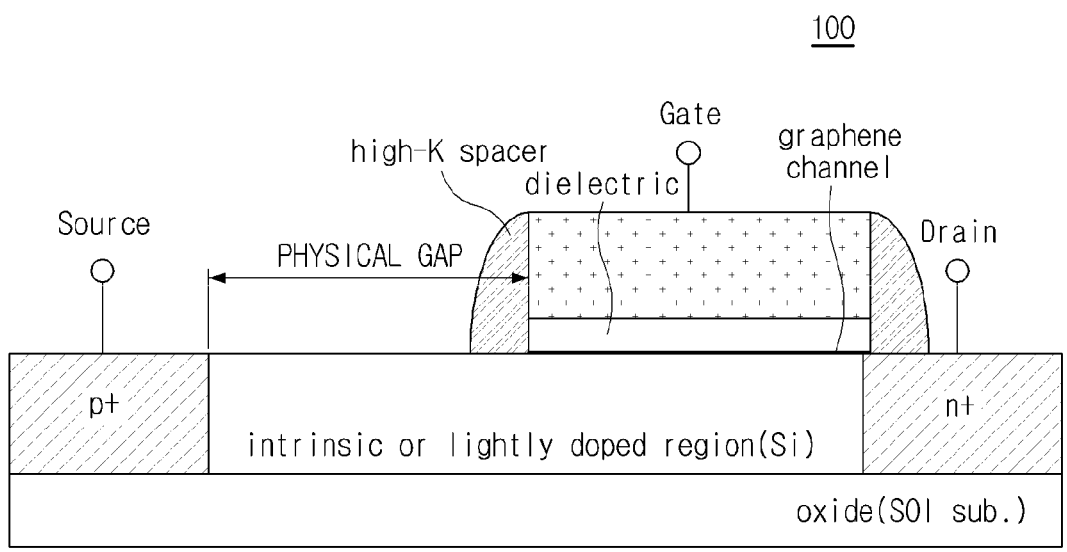
FIG. 1 shows the structure of a graphene device according to one embodiment of the present invention.

Hereinafter, preferred embodiments of the present invention will be described with reference to the accompanying drawings and the details shown in the drawings, but the scope of the present invention is not limited to these embodiments.

FIG. 1 shows the structure of a graphene device 100 according to one embodiment of the present invention.

Referring to FIG. 1, the graphene device 100 having a physical gap according to one embodiment of the present invention comprises: source and drain electrodes formed on a substrate (sub); and a gate electrode formed on a graphene channel formed on the substrate between the source and the drain, wherein the source and the graphene channel are intentionally spaced apart from each other by a physical gap. The drain may be extended to beneath the graphene channel so as to be in contact with the graphene channel.

Also, on the left and right sides (sides toward the source/drain) of a stack structure consisting of the graphene channel, the dielectric layer and the gate, a high-K spacer is formed. The high-K spacer may be made of a dielectric material having a dielectric constant of 3.9 or higher, such as hafnium dioxide ($HfO_2$) or zirconium dioxide ($ZrO_2$).

In this regard, the substrate may be an intrinsic silicon substrate or a lightly doped SOI (Silicon-on-Insulator) substrate in which silicon on a dielectric layer such as an oxide layer is lightly doped with an impurity (doped at an impurity concentration lower than that of the source and the drain). Also, the source formed on the substrate is doped with a p-type impurity so as to have a p+ conductivity higher than a certain level (the source has an impurity concentration higher than the substrate), and the drain is doped with an n-type impurity so as to have an n+ conductivity higher than a certain level (the concentration of the impurity in the drain is higher than in the substrate). The upper portion of the source or the drain may be treated with a metal to form a silicon compound (silicide), such as NiSi, CoSi, PtSi, NaSi, MgSi, TiSi, CuSi, CrSi, VSi, MnSi, FeSi, MnSi, GeSi, SnSi, PbSi, CaSi, RuSi, CeSi, RhSi, IrSi, ZrSi, HfSi, ThSi, PuSi, YSi, SrSi, USi, or WSi.

Figure 2A:
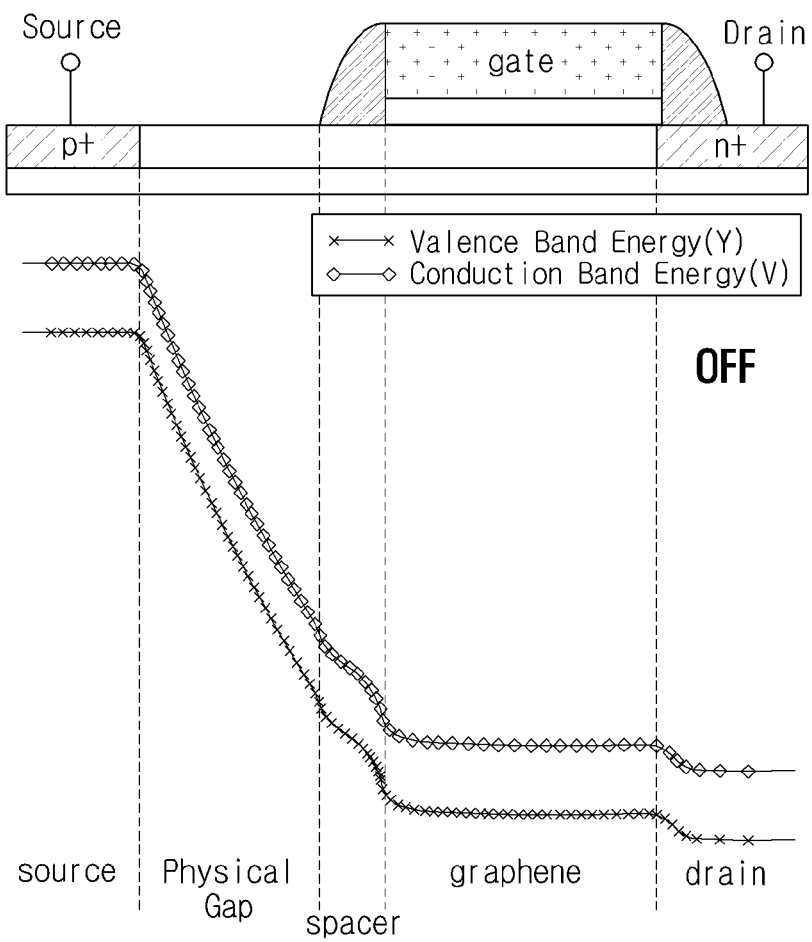
FIG. 2A shows the simulation results of the band diagram of the graphene device of FIG. 1 in off state.

In FIG. 1, in an off-state in which a voltage lower than the threshold voltage of the device is applied to the gate, a very small amount of drain current (current flowing from the source to the drain) will flow, because the drain current is determined by the reverse leakage current of a PIN diode present between the p+-doped source and the n+-doped drain. Herein, "PIN" means a p type silicon-intrinsic silicon (or SOI)-n type silicon. In this state, as can be seen in the band structure of the valence band and conduction band shown the FIG. 2A, the silicon substrate region present under the high-K spacer is not yet inversed.

Figure 2B:
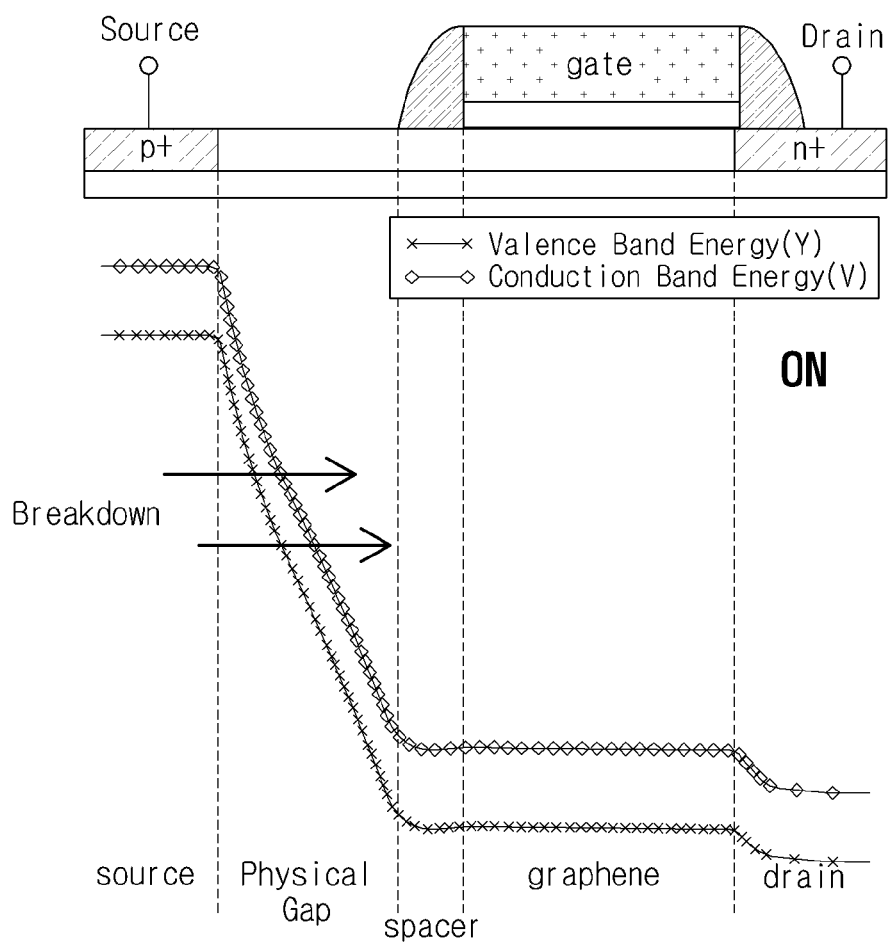
FIG. 2B shows the simulation results of the band diagram of the graphene device of FIG. 1 in on state.

On the other hand, when a voltage higher than the threshold voltage of the device is applied to the gate so that the device is in an on-state, a strong fringing field is formed by the high-K spacer between the graphene channel and p+ doped source, and thus as can be seen in the energy band diagram shown on the FIG. 2B, the silicon substrate region present under the high-K spacer is inversed, so that the effective length of the physical gap is reduced and the magnitude of the electric field that is applied to the physical gap increases, thus causing a breakdown in the substrate region corresponding to the physical gap.

Figure 3:
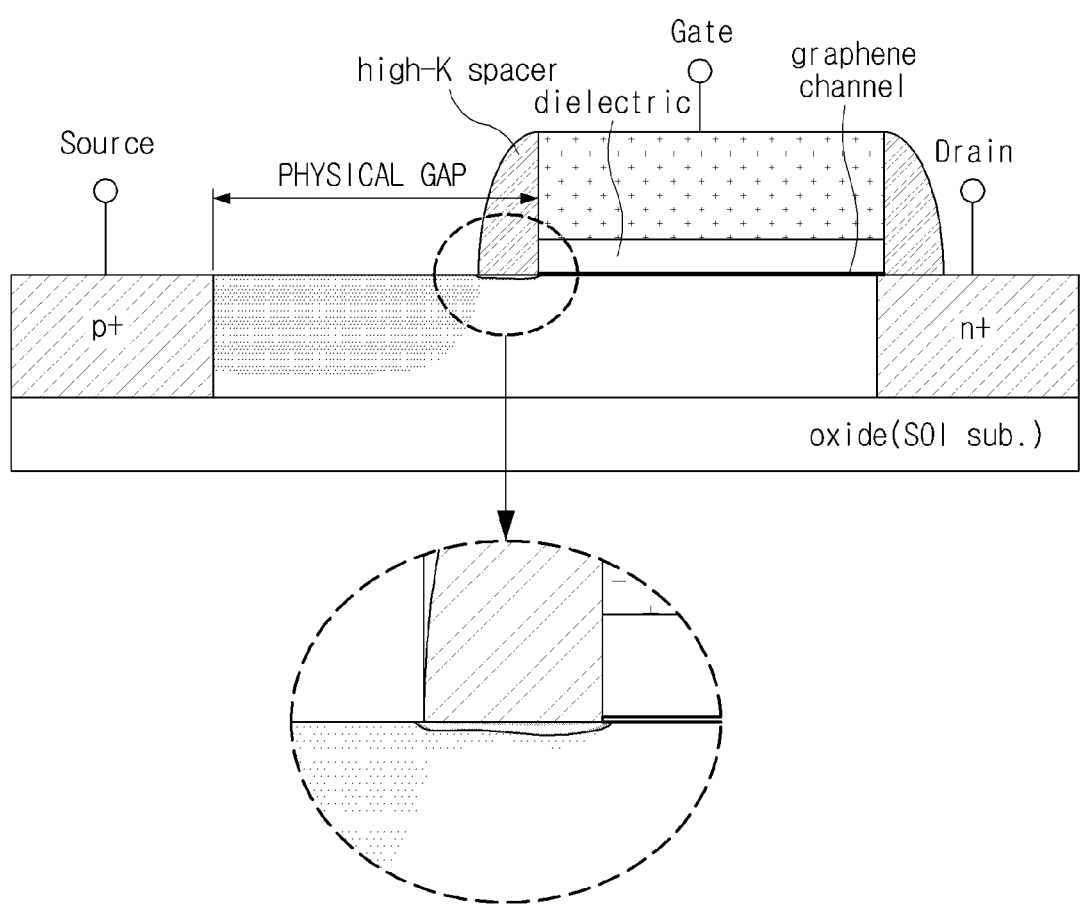
FIG. 3 shows the current density of the graphene device of FIG. 1 in an on-state.

As shown in FIG. 3, due to impact ionization occurring in the physical gap as a result of the breakdown, the produced current reaches the graphene channel and flows mostly through the graphene, and for this reason, the device can show a high on-current due to the high electron mobility of the graphene.

Figure 4A:
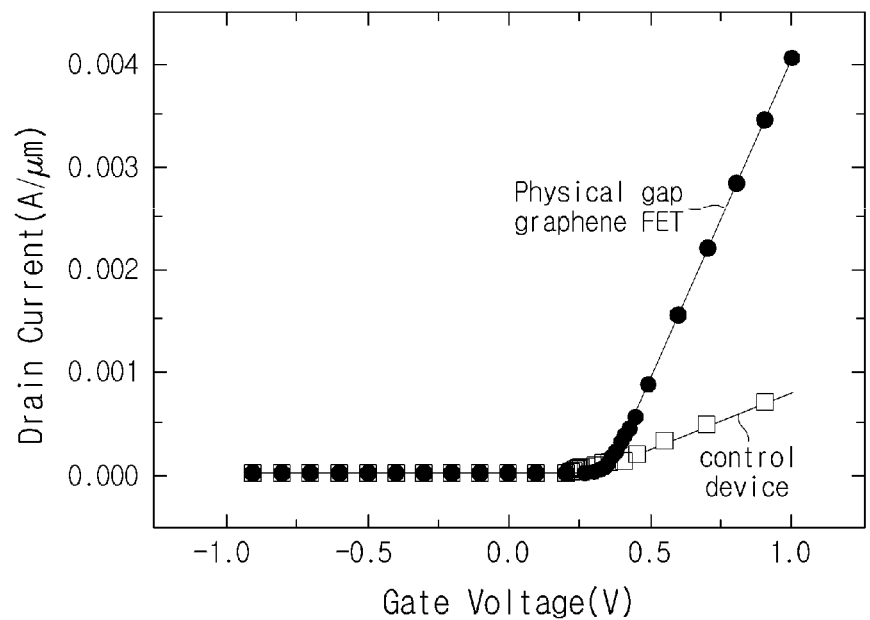
FIG. 4A is a graph showing a comparison of I-V characteristics between a graphene device according to one embodiment of the present invention and a control device having no graphene.
Figure 4B:
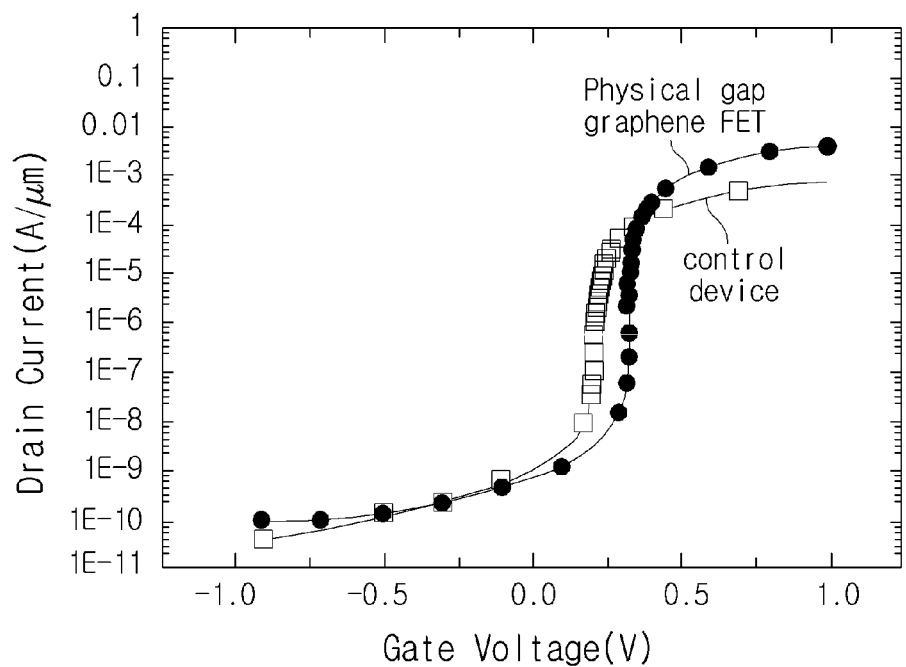
FIG. 4B is a graph showing a comparison of I-V characteristics between a graphene device according to one embodiment of the present invention and a control device having no graphene.

The I-V (current-voltage) characteristics of the graphene device 100 according to one embodiment of the present invention and a control device having no graphene were simulated. As a result, in both a large-size device as can be seen in FIG. 4A and a small-size device as shown in FIG. 4B, the graphene device 100 showed a 10 times higher on-current and a 50% higher subthreshold slope compared to the control device, and the graphene device 100 showed an on/off current ratio (drain current ratio) of $10^7$ or higher. The use of such results will make it possible to fabricate a graphene device for commercial use having a very high mobility and on/off current ratio.

Figure 5:
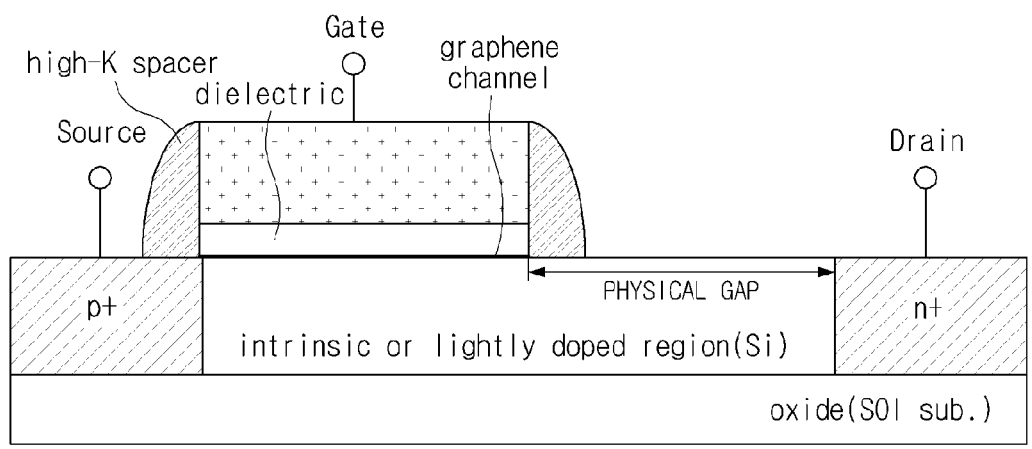
FIG. 5 shows the structure of a graphene device according to another embodiment of the present invention.

FIG. 5 shows the structure of a graphene device 200 according to another embodiment of the present invention.

Referring to FIG. 5, the graphene device 200 according to another embodiment of the present invention is only a slight modification of the graphene device 100 of FIG. 1. In the graphene device 200, the drain and the graphene channel are formed to be spaced apart from each other by the physical gap, and the source may be extended to the graphene channel so as to come into contact with the graphene channel. On the left and right sides (sides toward the source/drain) of the stack consisting of the graphene channel, the dielectric layer and the gate, a high-K spacer is formed, like the case of FIG. 1, and other features are similar to those of FIG. 1. This graphene device 200 can also show improved characteristics compared to the conventional control device, as shown in FIGS. 2, 3, 4A and 4B.

Figure 6:
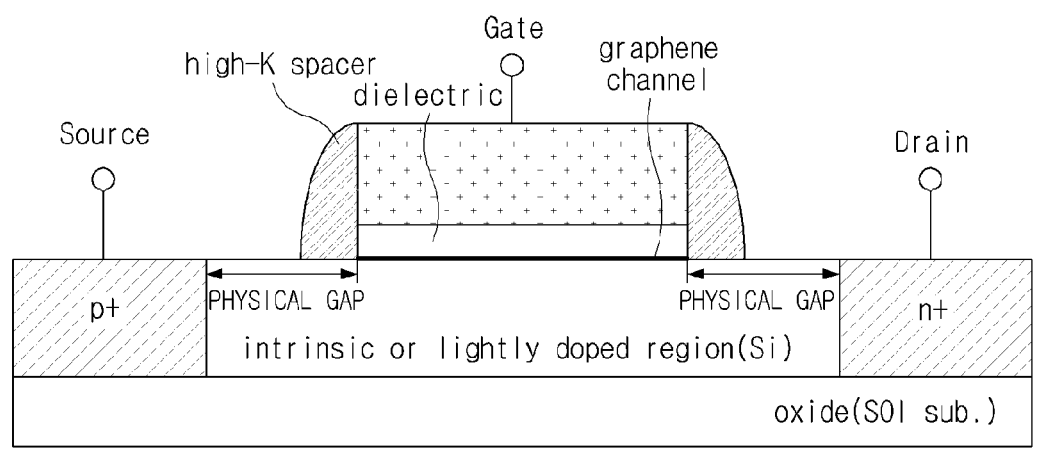
FIG. 6 shows the structure of a graphene device according to yet another embodiment of the present invention.

FIG. 6 shows the structure of a graphene device 300 according to still another embodiment of the present invention.

Referring to FIG. 6, the graphene device 300 according to still another embodiment of the present invention is a slight modification of the graphene device 100 of FIG. 1. In the graphene device 300, the graphene channel is formed to be spaced apart from both the source and the drain. On the left and right sides (sides toward the source/drain) of the stack consisting of the graphene channel, the dielectric layer and the gate, a high-K spacer is formed, like the case of FIG. 1, and other features are similar to those of FIG. 1. This graphene device 300 can also show improved characteristics compared to the conventional control device, as shown in FIGS. 2, 3, 4A and 4B.

Figure 7:
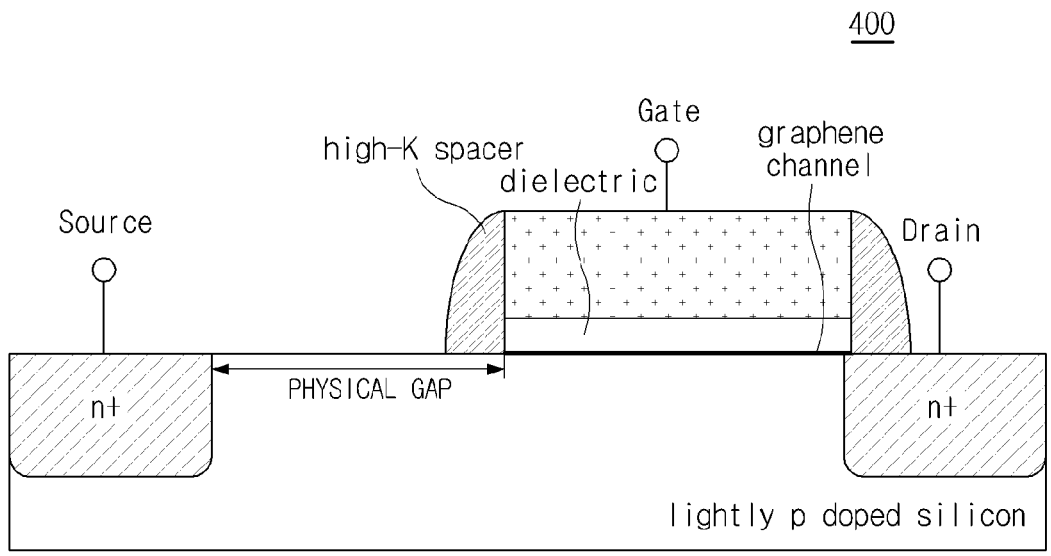
FIG. 7 shows the structure of a graphene device according to yet another embodiment of the present invention.

FIG. 7 shows the structure of a graphene device 400 according to still another embodiment of the present invention.

Referring to FIG. 7, the graphene device 400 according to still another embodiment of the present invention is a slight modification of the graphene device 100 of FIG. 1. In the graphene device 400, the substrate is a lightly doped silicon substrate in which silicon is lightly doped with a p-type impurity (doped at an impurity concentration lower than the source and the drain), and the source and the drain are all doped with an n-type impurity so that they have an n+ conductivity higher than a certain level (they have an impurity concentration higher than the substrate). Other features are similar to those of FIG. 1. This graphene device 400 can also show improved characteristics compared to the conventional control device, as shown in FIGS. 2, 3, 4A and 4B.

Figure 8:
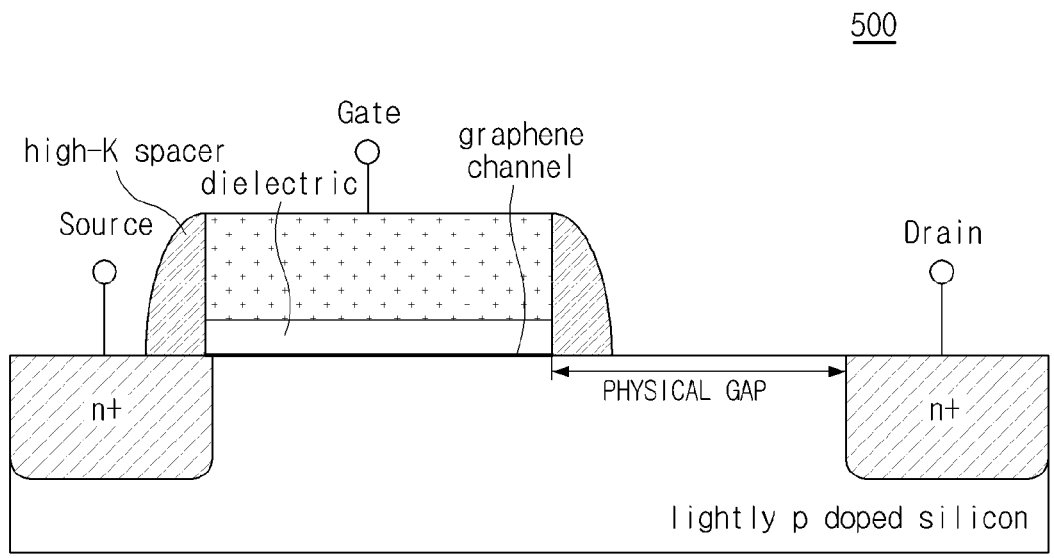
FIG. 8 shows the structure of a graphene device according to yet another embodiment of the present invention.

FIG. 8 shows the structure of a graphene device 500 according to still another embodiment of the present invention.

Referring to FIG. 8, the graphene device 500 according to still another embodiment of the present invention is a slight modification of the graphene device 200 of FIG. 5. In the graphene device 500, the substrate is a lightly doped silicon substrate in which silicon is lightly doped with a p-type impurity (doped at an impurity concentration lower than the source and the drain), and the source and the drain are all doped with an n-type impurity so that they have an n+ conductivity higher than a certain level (they have an impurity concentration higher than the substrate). Other features are similar to those of FIG. 5. This graphene device 500 can also show improved characteristics compared to the conventional control device, as shown in FIGS. 2, 3, 4A and 4B.

Figure 9:
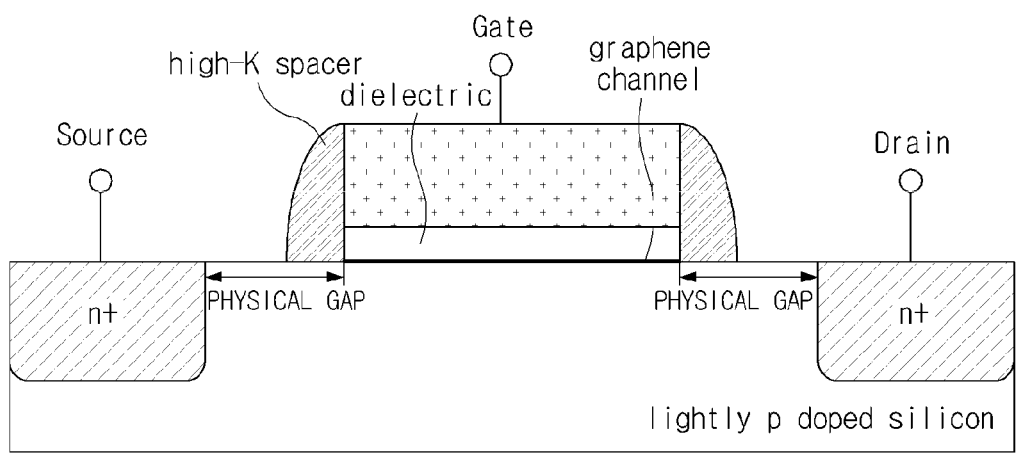
FIG. 9 shows the structure of a graphene device according to yet another embodiment of the present invention.

FIG. 9 shows the structure of a graphene device 600 according to still another embodiment of the present invention.

Referring to FIG. 9, the graphene device 600 according to still another embodiment of the present invention is a slight modification of the graphene device 300 of FIG. 6. In the graphene device 600, the substrate is a lightly doped silicon substrate in which silicon is lightly doped with a p-type impurity (doped at an impurity concentration lower than the source and the drain), and the source and the drain are all doped with an n-type impurity so that they have an n+ conductivity higher than a certain level (they have an impurity concentration higher than the substrate). Other features are similar to those of FIG. 6. This graphene device 600 can also show improved characteristics compared to the conventional control device, as shown in FIGS. 2, 3, 4A and 4B.

Figure 10:
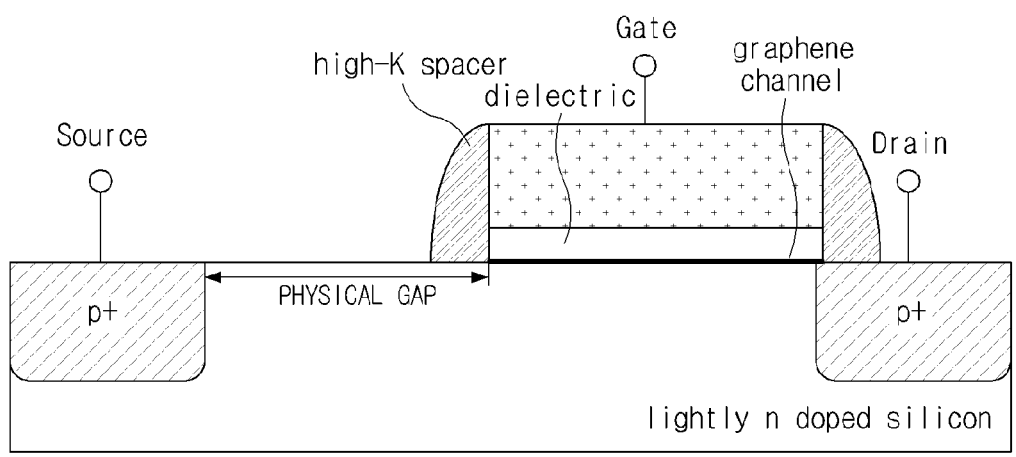
FIG. 10 shows the structure of a graphene device according to yet another embodiment of the present invention.

FIG. 10 shows the structure of a graphene device 700 according to still another embodiment of the present invention.

Referring to FIG. 10, the graphene device 700 according to still another embodiment of the present invention is a slight modification of the graphene device 100 of FIG. 1. In the graphene device 700, the substrate is a lightly doped silicon substrate in which silicon is lightly doped with an n-type impurity (doped at an impurity concentration lower than the source and the drain), and the source and the drain are all doped with a p-type impurity so that they have a p+ conductivity higher than a certain level (they have an impurity concentration higher than the substrate). Other features are similar to those of FIG. 6. This graphene device 700 can also show improved characteristics compared to the conventional control device, as shown in FIGS. 2, 3, 4A and 4B.

As described above, the substrate that is used in the graphene device of the present invention may be an intrinsic silicon substrate, or a lightly doped silicon substrate in which silicon is lightly doped with an n- or p-type impurity (doped at an impurity concentration lower than the source and the drain), or a lightly doped SOI (Silicon-on-Insulator) substrate in which silicon on a dielectric layer such as an oxide layer is lightly doped with an impurity (doped at an impurity concentration lower than the source and the drain).

Also, in the graphene device structure of the present invention, the source and the drain, which are formed on the substrate, may be doped with p+ and n+, n+ and n+, or p+ and p+, respectively, and although not shown, these may also be doped with n+ and p+, respectively. In order to reduce contact resistance during a metal interconnection process to be carried out later to provide an ohmic contact with a metal, the upper portion of the source or the drain may be treated with a metal to form a silicon compound (silicide), such as NiSi, CoSi, PtSi, NaSi, MgSi, TiSi, CuSi, CrSi, VSi, MnSi, FeSi, MnSi, GeSi, SnSi, PbSi, CaSi, RuSi, CeSi, RhSi, IrSi, ZrSi, HfSi, ThSi, PuSi, YSi, SrSi, USi, or WSi.

In addition, although the present invention has been described with reference to the embodiment in which the substrate is made of a silicon-based material, the substrate may also be made of a semiconductor material, such as germanium (Ge), a III-V group compound (GaAs, InP, etc.), or combinations thereof (e.g., SiGe), in place of silicon.

Also, although the structure in which any one or more of the source and the drain are spaced apart from the graphene channel by the physical gap has been described heretofore, the present invention encompasses the case in which the graphene channel is formed between the source and the drain and consists of a plurality of graphene channels spaced apart from each other by one or more physical gaps. In this case, on the dielectric layers over the plurality of graphene channels formed between the source and the drain, different gates and high-K spacers may be formed. For example, in the present invention, the following first and second structures may be formed to be spaced apart from each other by a physical gap: the first structure in which a first high-K spacer is formed on the left and right sides (sides toward the source/drain) of a stack structure consisting of a first graphene channel, a first dielectric layer and a first gate); and the second structure in which a second high-K spacer is formed on the left and right sides (sides toward the source/drain) of a stack structure consisting of a second graphene channel, a second dielectric layer and a second gate). In this case, any one or more of the source and the drain may be formed to be spaced apart from the first graphene channel or the second graphene channel by the physical gap. The source or the drain which is not spaced apart from the graphene channel by the physical gap may be extended to the first or second graphene channel so as to come into contact with the graphene channel.

As described above, in the graphene device structure according to the present invention, whether the breakdown of the physical gap occurs is determined by a fringing field that is applied to the high-K spacer, so that the on/off state of the device is induced, whereby the off current of the device is determined by the physical gap. Accordingly, the graphene device of the present invention has a very high on/off current ratio, and thus can provide a future semiconductor device which will substitute for the current semiconductor device.

Although the preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A graphene device comprising:
   a source and a drain, formed on a substrate;
   a stack structure having a graphene channel formed on the substrate between the source and the drain, a dielectric layer on the graphene channel, and a gate formed on the dielectric layer; and
   a high-K spacer made of a dielectric material on the left and right sides of the stack structure,
   in which any one or more of the source and the drain are spaced apart from the graphene channel by a physical gap extending in a planar direction,
   wherein the physical gap includes a thickness of the high-K spacer and an empty space spaced apart from the graphene channel,
   wherein when a voltage lower than the threshold voltage of the device is applied to the gate, the off-current of the device is reduced due to the physical gap, and when a voltage higher than the threshold voltage is applied to the gate, a fringing field is formed by the high-K spacer, so that the energy band of the substrate region under the high K-spacer is inversed and the effective length of the physical gap is reduced to increase the on-current of the device because of a breakdown occurring in the substrate region corresponding to the physical gap.

2. The graphene device of claim 1, wherein the high-K spacer is made of a material having a dielectric constant of 3.9 or higher.

3. The graphene device of claim 1, wherein the substrate is made of a semiconductor material selected from among silicon (Si), germanium (Ge), a III-V group compound (GaAs, InP, etc.), and combinations thereof.

4. The graphene device of claim 1, wherein the substrate comprises an SOI structure.

5. The graphene device of claim 1, wherein the substrate is made of an intrinsic semiconductor material or a semiconductor material doped with an n- or p-type impurity.

6. The graphene device of claim 1, wherein the source and the drain are doped with p+ and p+, n+ and n+, n+ and p+, or p+ and n+, respectively, wherein p+ means that the source or the drain is doped with a p-type impurity so that the impurity concentration thereof is higher than that of the substrate, and n+ means that the source or the drain is doped with an n-type impurity so that the impurity concentration is higher than that of the substrate.

7. The graphene device of claim 1, wherein the upper portion of the source or the drain is treated with a metal to form a silicon compound (silicide).

8. The graphene device of claim 7, wherein the silicon compound is NiSi, CoSi, PtSi, NaSi, MgSi, TiSi, CuSi, CrSi, VSi, MnSi, FeSi, MnSi, GeSi, SnSi, PbSi, CaSi, RuSi, CeSi, RhSi, IrSi, ZrSi, HfSi, ThSi, PuSi, YSi, SrSi, USi or WSi.

9. The graphene device of claim 1, wherein the source is spaced apart from the graphene channel by the physical gap present between the source and the graphene channel, and the drain is extended to the graphene channel so as to come into contact with the graphene channel.

10. The graphene device of claim 1, wherein the drain is spaced apart from the graphene channel by the physical gap present between the drain and the graphene channel, and the source is extended to the graphene channel so as to come into contact with the graphene channel.

11. The graphene device of claim 1, wherein both the source and the drain are spaced apart from the graphene channel by the physical gap.

12. The graphene device of claim 1, wherein the graphene channel includes a plurality of graphene channels spaced apart from each other by a physical gap.

13. The graphene device of claim 12, wherein a gate is formed on a dielectric layer formed on each of the plurality of graphene channels, and a high-K spacer is formed on the left and right sides of each of stack structures, which are spaced apart from each other and each includes the graphene channel, the dielectric layer and the gate.

* * * * *